(12) United States Patent
Kao

(10) Patent No.: US 7,126,322 B1
(45) Date of Patent: Oct. 24, 2006

(54) CIRCUIT TO CHARACTERIZE MATCHING OF ENERGY-STORAGE COMPONENTS

(75) Inventor: Ching-Hung Kao, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/163,437

(22) Filed: Oct. 19, 2005

(51) Int. Cl.
 *H01G 4/002* (2006.01)
(52) U.S. Cl. .................................. 324/76.66; 324/548
(58) Field of Classification Search ............. 324/76.66, 324/658, 548
See application file for complete search history.

(56) References Cited

U.S. PATENT DOCUMENTS 4,805,063 A * 2/1989 Kataoka et al. ............... 361/16
6,504,380 B1 * 1/2003 Bianchi et al. ............. 324/548

* cited by examiner

*Primary Examiner*—Walter Benson
(74) *Attorney, Agent, or Firm*—Jiang Chyun IP Office

(57) ABSTRACT

A circuit to characterize the matching of energy-storage components is provided. The circuit includes a linear resistor and a power source. The circuit is electrically connected to two serially connected energy-storage elements, for example, a pair of capacitors. The matching between the two capacitors can be evaluated by measuring the slopes of a function relating the input and the output voltageof the circuit.

5 Claims, 3 Drawing Sheets

CIRCUIT TO CHARACTERIZE MATCHING OF ENERGY-STORAGE COMPONENTS

BACKGROUND OF THE INVENTION

1. Field of the Invention

The present invention relates to a circuit to characterize the matching of electronic components. More particularly, the present invention relates to a circuit to characterize the matching of energy-storage components.

2. Description of the Related Art

In a mixed mode circuit design, the matching between neighboring devices is very important. Using capacitors as an example, measuring the matching condition between two neighboring capacitors can provide the circuit designers with important information in terms of circuit design. However, the accuracy of most capacitance measuring meters is often too low to obtain a precise capacitance value for assessing the degree of matching between two capacitors.

FIG. 1 is a circuit diagram showing a conventional circuit for characterizing the matching of capacitors. The circuit 10 comprises a PMOS transistor 11 and a current supply 13. The first source/drain terminal of the PMOS transistor 11 is electrically connected to the current supply 13 and the output voltage $V_{out}$. Two capacitors to be measured are a first capacitor 91 and a second capacitor 93. A second terminal of the first capacitor 91 is electrically connected to a first terminal of the second capacitor 93 and a gate terminal of the PMOS transistor 11.

If the first terminal of the first capacitor 91 is P1 and the second terminal of the capacitor 93 is P3, the conventional method is to connect P3 of the second capacitor 93 to a ground and to connect P1 of the first capacitor 91 to an input voltage $V_{ina}$ to produce an output voltage $V_{outa}$. Here, assuming that the first capacitor 91 has a capacitance C1 and the second capacitor 93 has a capacitance C3, then the relationship between the input voltage $V_{ina}$ and the output voltage $V_{outa}$ can be given by the following formula:

$$V_{outa} = V_{ina} \times C1/(C1+C3+C_{par}) \quad (1).$$

Similarly, if the P1 terminal of the first capacitor 91 is electrically connected to the input voltage $V_{inb}$ to produce a corresponding output voltage $V_{outb}$, then the relationship between the input voltage $V_{inb}$ and the output voltage $V_{outb}$ can be given by the following formula:

$$V_{outb} = V_{inb} \times C1/(C1+C3+C_{par}) \quad (2).$$

FIG. 2 is a graph showing the functional relationship between the input voltage $V_{in}$ and the output voltage $V_{out}$. As shown in FIG. 2, the straight line 21 shows the functional relationship between the input voltage $V_{in}$ and the output voltage $V_{out}$ and the value of the slope S1 can be represented using the following formula:

$S1=(V_{outb}-V_{outa})/(V_{inb}-V_{ina})$, and according to formulae (1) and (2), the above formula can be given by:

$$S1 = C1/(C1+C3+C_{par}) \quad (3),$$ wherein $C_{par}$ is the parasitic capacitance of the conventional circuit 10.

Thereafter, the terminal P1 of the first capacitor 91 is connected to a ground and the terminal P3 of the second capacitor 93 is electrically connected to a dc input voltage $V_{in}$. Similarly, the slope S2 (the slope of the straight line 22) of the functional relationship between the input voltage and the output voltage can be obtained from the following formula:

$$S2 = C3/(C1+C3+C_{par}) \quad (4).$$

After some operation of formulae (3) and (4), the following formula is obtained:

$$2 \times (S1-S2)/(S1+S2) = 2 \times (C1-C2)/(C1+C2) \quad (5).$$

According to formula (5), if the two slopes S1 and S2 of the functional relation between the input voltage and the output voltage are obtained, the degree of matching between the first capacitor 91 and the second capacitor 93 can be computed.

However, the conventional method has the following disadvantages.

1. If the capacitors to be measured have a large capacitance or are inter-digital capacitors, the PMOS transistor can be easily damaged due to the antenna effect, such that the measurement cannot be achieved.

2. The PMOS transistor can have a variety of designs or specifications so that the testing conditions need to be changed constantly. In other words, the person taking the measurement must set up a new set of testing conditions to reflect the design and specification of the PMOS transistor. Thus, the measuring process is complicated and cumbersome.

3. As shown in FIG. 3, which is a graph showing the functional relationship between the input voltage and the output voltage for matching different capacitors with different sizes of capacitance using a conventional circuit, the shape of the function differs for each capacitance value. Furthermore, the PMOS transistor is a non-linear device so that only a portion of the graph has a linear characteristic. If the area for getting the slope lies in a non-linear region, an accurate result cannot be obtained.

SUMMARY OF THE INVENTION

Accordingly, at least one objective of the present invention is to provide a circuit for characterizing the matching of energy-storage elements capable of accurately finding the matching parameters between two energy-storage elements such as capacitors through a computation.

To achieve this and other advantages and in accordance with the purpose of the invention, as embodied and broadly described herein, the invention provides a circuit for characterizing the degree of matching between a first energy-storage element and a second energy-storage element. A second terminal of the first energy-storage element is electrically coupled to a first terminal of the second energy-storage element. In the present invention, the circuit includes a linear resistor and a power supply. A first terminal of the linear resistor is electrically connected to a signal output terminal of the circuit of the present invention and a second terminal of the linear resistor is electrically connected to a second terminal of the first energy-storage element and a first terminal of the second energy-storage element. Furthermore, the output from the power supply is electrically connected to the second terminal of the linear resistor.

In one embodiment of the present invention, both the first energy-storage element and the second energy-storage element are capacitors. Furthermore, the power supply can be a current supply, for example.

The major characteristics of the present invention include the following. First, the first terminal of a first energy-storage element is electrically connected to a dc voltage to serve as the signal input terminal of the circuit. Furthermore, the second terminal of the second energy-storage element is grounding. Then, the relationship between the signal input terminal and the signal output terminal is measured to obtain a first relation function. Thereafter, the first terminal of the first energy-storage element is grounding and the second terminal of the second energy-storage element is electrically coupled to the dc voltage to serve as the signal input terminal of the circuit. Then, the relationship between the signal input terminal and the signal output terminal is measured to obtain a second relation function. After that, the matching parameter between the first energy-storage element and the second energy-storage element is obtained according to the first relation function and the second relation function.

Because the present invention uses a linear resistor, the input voltage and the output voltage of the circuit has a pure straight line functional relationship, and the problem of the conventional PMOS transistor being damaged due to interference resulting from the antenna effect, can be prevented. Moreover, with a straight-line functional relation between the input voltage and the output voltage of the circuit since a linear resistor serves as the linear element, the defects of having a non-linearity relation between the input voltage and the output voltage in a conventional circuit can be improved. Hence, the matching measurement accuracy can be highly enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
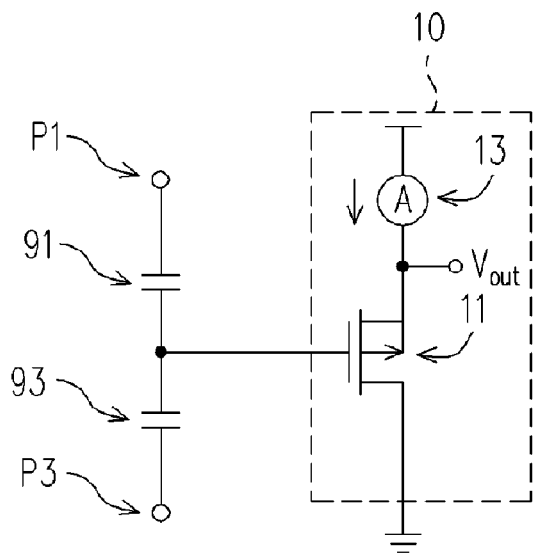
FIG. 1 is a circuit diagram showing a conventional circuit for characterizing the matching of capacitors.
Figure 2:
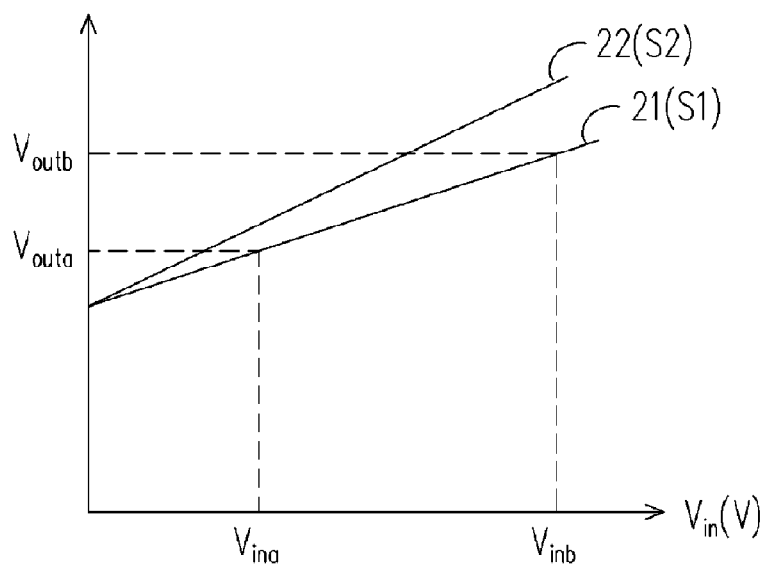
FIG. 2 is a graph showing the functional relationship between the input voltage $V_{in}$ and the output voltage $V_{out}$.
Figure 3:
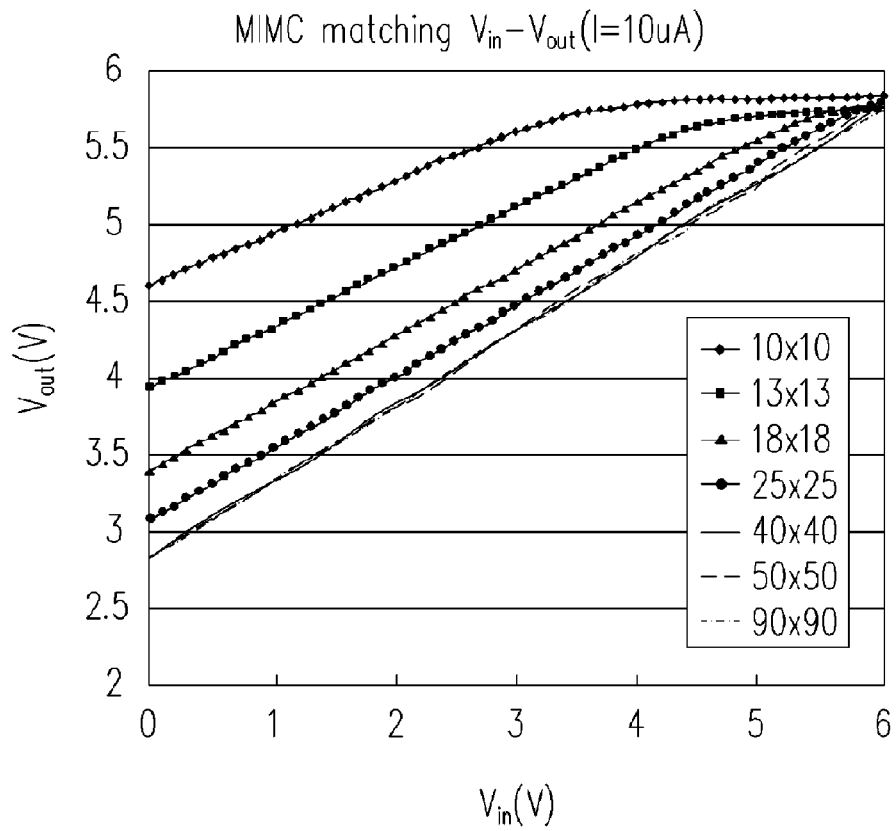
FIG. 3 is a graph showing the functional relationship between the input voltage and the output voltage for matching different capacitors with different sizes of capacitance using a conventional circuit.

Reference will now be made in detail to the present preferred embodiments of the invention, examples of which are illustrated in the accompanying drawings. Wherever possible, the same reference numbers are used in the drawings and the description to refer to the same or like parts.

Figure 4:
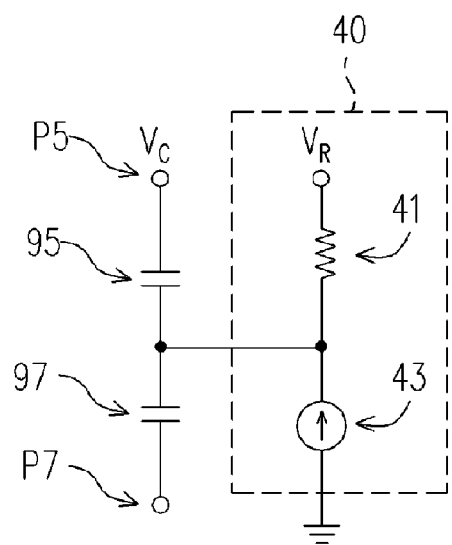
FIG. 4 is a circuit for characterizing the degree of matching between energy-storage elements according to the present invention.

FIG. 4 is a circuit for characterizing the degree of matching between energy-storage elements according to the present invention. As shown in FIG. 4, the circuit 40 in the present invention is used for testing the matching condition between energy-storage elements such as a first capacitor 95 and a second capacitor 97. A second terminal of the first capacitor 95 is electrically coupled to a first terminal of the second capacitor 97. In the present embodiment, the circuit 40 mainly comprises a linear resistor 41 and a current supply 43. A first terminal of the linear resistor 41 is coupled to an output voltage signal $V_R$ and a second terminal of the linear resistor 41 is coupled to a second terminal of the first capacitor 95. In the present embodiment, the first terminal of the first capacitor 95 is labeled P5 and the second terminal of the second capacitor 97 is labeled P7.

Figure 5:
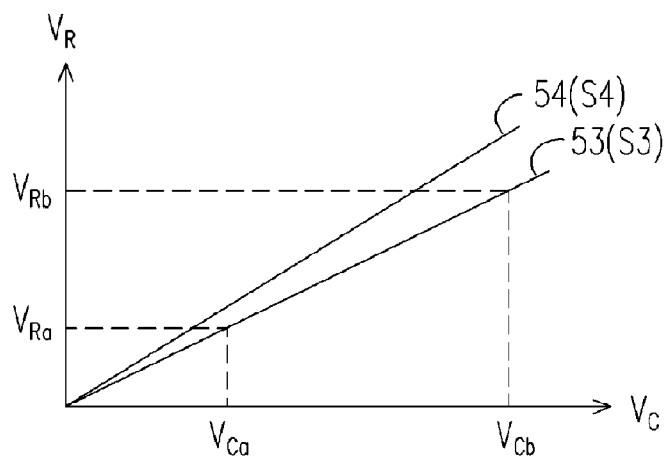
FIG. 5 is a graph showing the functional relationship between the input voltage and the output voltage of the circuit according to the present invention.

FIG. 5 is a graph showing the functional relationship between the input voltage and the output voltage of the circuit according to the present invention. Assuming the resistance of the linear resistor 41 in the present embodiment is R, the value of the current output from the current supply 43 is I, the capacitance of the first capacitor 95 is C5 and the capacitance of the second capacitor 97 is C7. The method of the present invention includes the following. First, the terminal P7 of the capacitor 97 is connected to the ground. Then, the terminal P5 of the capacitor 95 is electrically coupled to an input voltage $V_{Ca}$ and an output voltage $V_{Ra}$ is obtained from the first terminal of the linear resistor 41. The relationship between the input voltage $V_{Ca}$ and the output voltage $V_{Ra}$ can be given by:

$$V_{Ra}=V_{Ca}\times C5/(C5+C7+C_{par1})+I\times R \qquad (6).$$

Similarly, if the terminal P5 of the first capacitor 95 is electrically coupled to an input voltage $V_{Cb}$, an output voltage $V_{Rb}$ is provided at the first terminal of the linear resistor 41. The relationship between the input voltage $V_{Cb}$ and the output voltage $V_{Rb}$ can be given by:

$$V_{Rb}=V_{Cb}\times C5/(C5+C7+C_{par1})+I\times R \qquad (7).$$

According to the formulae (6) and (7), the slope between the input voltage $V_C$ and the output voltage $V_R$, in other words, the slope of the straight line 53, is given as: S3= $(V_{Rb}-V_{Ra})/(V_{Cb}-V_{Ca})$=C5/(C5+C7+$C_{par1}$) (8).

As shown in FIG. 5, the slope S3 of the input voltage $V_C$ and the output voltage $V_R$ is the slope of the straight line 53. The capacitance $C_{par1}$ is the parasitic capacitance of the circuit 40 in the present invention.

Thereafter, the terminal P5 of the first capacitor 95 is connected to a ground and the terminal P7 of the second capacitor 97 is electrically coupled to a dc voltage $V_C$. According to the aforesaid method, the slope S4 of the relation between the input voltage $V_C$ and the output voltage $V_R$, in other words, the slope of the straight line 54, is given as:

$$S4=C7/(C5+C7+C_{par1}) \qquad (9).$$

After some operation on the formulae (8) and (9), the following formula is obtained:

$$2\times(S3-S4)/(S3+S4)=2\times(C5-C7)/(C5+C7) \qquad (10).$$

According to formula (10), if the two slopes S3 and S4 can be obtained from the functional relationship between the input voltage and the output voltage, a matching relation between the first capacitor 95 and the second capacitor 97 can be obtained through a computation.

In summary, the person performing the measurement needs to couple the terminal P5 to a dc input voltage VC and the terminal P7 to a ground. Hence, a graph showing the functional relationship between the input voltage $V_C$ and the output voltage $V_R$ can be obtained through measurements. The value of the slope S3 is found according to the graph. Thereafter, the terminal P7 is electrically coupled to a dc input voltage $V_C$ and the terminal P5 is connected to a ground. Hence, a graph showing the functional relationship between the input voltage $V_C$ and the output voltage $V_R$ can be obtained through measurements. The value of the slope S4 is found according to the graph. Finally, according to equation (10), the matching relation between the first capacitor 95 and the second capacitor 97 can be found.

The current supply 43 (for example: HPC4156) serves to provide a highly stable current to the circuit 40 so that the circuit 40 of the present invention can perform highly accurate measurements.

Figure 6:
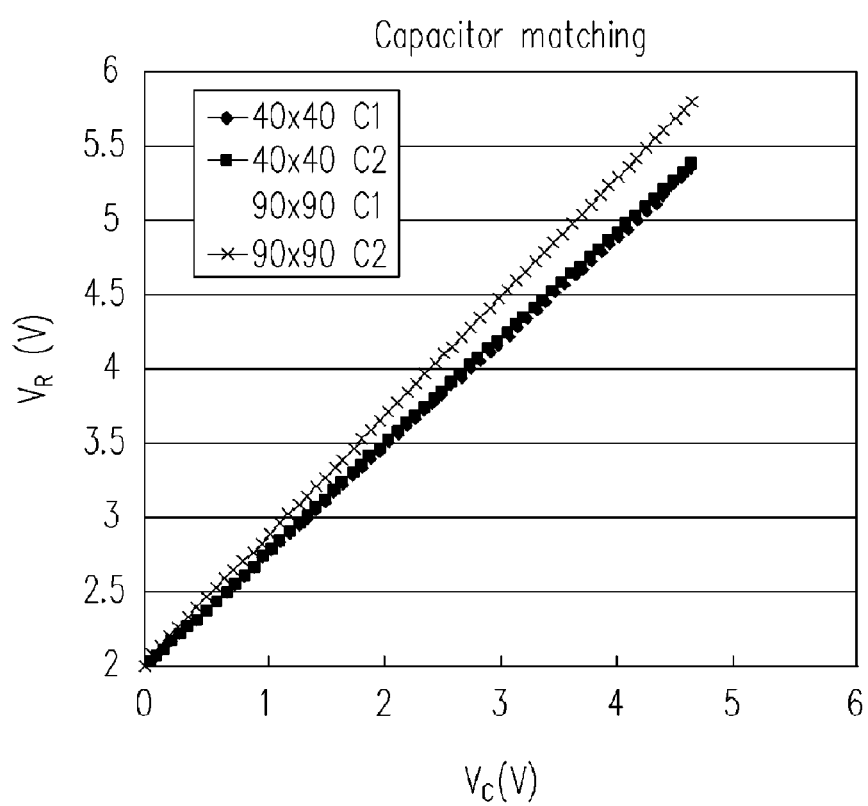
FIG. 6 is a graph showing the functional relationship between the input voltage and the output voltage of the circuit of the present invention through the measurement of capacitors having different capacitance values.

FIG. 6 a graph showing the functional relationship between the input voltage $V_C$ and the output voltage $V_R$ of the circuit 40 of the present invention through the measurement of capacitors having different capacitance values. As shown in FIG. 6, the value of the output voltage $V_R$ is smaller than half the value of the input voltage $V_C$, because a non-negligible parasitic capacitance $C_{par1}$ exists in the circuit 40 so that the proportion of the output voltage VR according to voltage division in the circuit 40 of the present invention is reduced. When the capacitance of the capacitor to be measured is larger (90*90), the weight of the parasitic capacitance $C_{par1}$ relative to the capacitance of the entire circuit is smaller. As a result, the output voltage value $V_R$ is very close to half of the input voltage value $V_C$ when the matching of larger capacitors (90*90) is measured.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit configured for checking a degree of a matching between a first energy-storage element and a second energy-storage element, wherein a second terminal of the first energy-storage element is coupled to a first terminal of the second energy-storage element, and the first energy-storage element and the second energy-storage element are electrically coupled in series; the circuit comprising:

a linear resistor, wherein a first terminal thereof is electrically coupled to a signal output terminal of the circuit and a second terminal thereof is electrically coupled to a second terminal of the first energy-storage element and a first terminal of the second energy-storage element; and a power supply having an output terminal electrically coupled to the second terminal of the linear resistor, applying a plurality of voltages to a first terminal of the first energy-storage element and a second terminal of the second energy-storage element to ground, whereby the degree of the matching between the first energy-storage element and the second energy-storage element is obtained.

2. The circuit of claim 1, wherein both the first energy-storage element and the second energy-storage element are capacitors.

3. The circuit of claim 1, wherein the power supply includes a current supply.

4. The circuit of claim 1, wherein the first terminal of the first energy-storage element is electrically coupled to a dc voltage and the second terminal of the second energy-storage element is grounding.

5. The circuit of claim 1, wherein the first terminal of the first energy-storage element is grounding and the second terminal of the second energy-storage element is electrically coupled to a dc voltage.

* * * * *